United States Patent
Konishi et al.

(10) Patent No.: US 12,021,118 B2
(45) Date of Patent: Jun. 25, 2024

(54) SEMICONDUCTOR DEVICE

(71) Applicant: Mitsubishi Electric Corporation, Tokyo (JP)

(72) Inventors: Kazuya Konishi, Tokyo (JP); Yusuke Fukada, Tokyo (JP); Ryu Kamibaba, Tokyo (JP); Mariko Umeyama, Tokyo (JP); Atsushi Narazaki, Tokyo (JP); Masayoshi Tarutani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 108 days.

(21) Appl. No.: 15/741,591

(22) PCT Filed: Aug. 26, 2015

(86) PCT No.: PCT/JP2015/074062
§ 371 (c)(1),
(2) Date: Jan. 3, 2018

(87) PCT Pub. No.: WO2017/033315
PCT Pub. Date: Mar. 2, 2017

(65) Prior Publication Data
US 2018/0204909 A1  Jul. 19, 2018

(51) Int. Cl.
*H01L 29/06* (2006.01)
*H01L 27/06* (2006.01)
(Continued)

(52) U.S. Cl.
CPC ...... *H01L 29/0696* (2013.01); *H01L 27/0664* (2013.01); *H01L 29/1095* (2013.01);
(Continued)

(58) Field of Classification Search
CPC ... H01L 29/7803–7808; H01L 29/0696; H01L 29/7813; H01L 29/407; H01L 29/7805
See application file for complete search history.

(56) References Cited

U.S. PATENT DOCUMENTS 6,153,896 A * 11/2000 Omura ............... H01L 29/7395
257/E29.198
6,388,285 B1 * 5/2002 Black .................... H10B 53/30
257/310
(Continued)

FOREIGN PATENT DOCUMENTS

CN 101582443 A * 11/2009 ......... H01L 29/7397
CN 101582443 A 11/2009
(Continued)

OTHER PUBLICATIONS

JP-2012165018-A machine translation (Year: 2012).*
(Continued)

*Primary Examiner* — Vincent Wall
(74) *Attorney, Agent, or Firm* — Studebaker & Brackett PC

(57) ABSTRACT

Included are a semiconductor substrate, an emitter electrode formed on the semiconductor substrate, a gate electrode formed on the semiconductor substrate, a source layer of a first conductivity type formed on the semiconductor substrate, a base layer of a second conductivity type formed on the semiconductor substrate, a collector electrode formed under the semiconductor substrate, a plurality of active trench gates formed on a top-surface side of the semiconductor substrate and connected to the gate electrode, and a plurality of dummy trench gates formed on the top-surface side of the semiconductor substrate and not connected to the gate electrode. First structures, each including three or more of the active trench gates arranged side by side, and second structures, each including three or more of the dummy trench gates arranged side by side, are alternately provided.

14 Claims, 9 Drawing Sheets

(51) Int. Cl.
  *H01L 29/10* (2006.01)
  *H01L 29/16* (2006.01)
  *H01L 29/20* (2006.01)
  *H01L 29/40* (2006.01)
  *H01L 29/739* (2006.01)
  *H01L 29/78* (2006.01)

(52) U.S. Cl.
  CPC ........ *H01L 29/1602* (2013.01); *H01L 29/407* (2013.01); *H01L 29/7397* (2013.01); *H01L 29/7805* (2013.01); *H01L 29/7813* (2013.01); *H01L 29/0619* (2013.01); *H01L 29/1608* (2013.01); *H01L 29/2003* (2013.01)

(56) References Cited

U.S. PATENT DOCUMENTS

| | | | |
|---|---|---|---|
| 6,906,356 B1* | 6/2005 | Chang | H01L 29/0692 257/130 |
| 9,466,711 B2* | 10/2016 | Momota | H01L 27/0658 |
| 2004/0043565 A1* | 3/2004 | Yamaguchi | H01L 29/7811 257/E29.256 |
| 2008/0048295 A1* | 2/2008 | Takahashi | H01L 29/7397 257/565 |
| 2008/0067542 A1 | 3/2008 | Tanaka et al. | |
| 2008/0211106 A1* | 9/2008 | Chang | H01L 21/76831 257/E23.141 |
| 2008/0310066 A1* | 12/2008 | Bobde | H01L 23/552 361/111 |
| 2009/0189181 A1* | 7/2009 | Koyama | H01L 29/0696 257/139 |
| 2009/0283797 A1 | 11/2009 | Takahashi et al. | |
| 2009/0289277 A1 | 11/2009 | Yamaguchi | |
| 2011/0193132 A1* | 8/2011 | Kouno | H01L 29/7391 257/E29.197 |
| 2012/0043581 A1* | 2/2012 | Koyama | H01L 29/8613 257/140 |
| 2012/0267680 A1* | 10/2012 | Oya | H01L 29/0696 257/139 |
| 2013/0037853 A1* | 2/2013 | Onozawa | H01L 29/41766 257/E29.198 |
| 2013/0099298 A1* | 4/2013 | Kim | H01L 29/42356 257/296 |
| 2014/0054644 A1* | 2/2014 | Hikasa | H01L 29/0696 257/139 |
| 2014/0070266 A1 | 3/2014 | Matsudai et al. | |
| 2014/0353748 A1* | 12/2014 | Ma | H01L 29/4236 257/334 |
| 2015/0091051 A1* | 4/2015 | Laven | H01L 29/4236 438/135 |
| 2015/0091052 A1* | 4/2015 | Laven | H01L 29/0821 438/135 |
| 2015/0091055 A1* | 4/2015 | Gejo | H01L 29/0619 257/142 |
| 2015/0144995 A1 | 5/2015 | Takahashi | |
| 2015/0200295 A1* | 7/2015 | Prabhakar | H01L 21/26586 257/344 |
| 2015/0221566 A1* | 8/2015 | Ookura | H01L 29/0696 257/48 |
| 2015/0262999 A1* | 9/2015 | Ogura | H01L 29/0834 257/140 |
| 2015/0311285 A1* | 10/2015 | Momota | H01L 29/4238 324/762.08 |
| 2015/0349103 A1 | 12/2015 | Onozawa et al. | |
| 2017/0250269 A1* | 8/2017 | Sumitomo | H01L 29/407 |
| 2020/0075483 A1* | 3/2020 | Zhou | H01L 23/53228 |
| 2020/0227603 A1* | 7/2020 | Pun | H01L 33/32 |

FOREIGN PATENT DOCUMENTS

| | | |
|---|---|---|
| CN | 107949916 B | 7/2021 |
| DE | 10 2011 080 891 A1 | 2/2012 |
| JP | H11-345969 A | 12/1999 |
| JP | 2002-016252 A | 1/2002 |
| JP | 2003-188382 A | 7/2003 |
| JP | 2006-032676 A | 2/2006 |
| JP | 2006032676 A * | 2/2006 ........ H01L 29/7397 |
| JP | 2008-205500 A | 9/2008 |
| JP | 2008205500 A * | 9/2008 |
| JP | 2010-004003 A | 1/2010 |
| JP | 2012-165018 A | 8/2012 |
| JP | 2012165018 A * | 8/2012 |
| JP | 2015-072950 A | 4/2015 |
| JP | 2015-103697 A | 6/2015 |
| JP | 6743026 B2 | 8/2020 |
| WO | 2014/174911 A1 | 10/2014 |
| WO | 2015/022989 A1 | 2/2015 |

OTHER PUBLICATIONS

JP-2008205500-A—machine translation (Year: 2008).*
Konishi et al., "Experimental Demonstration of the Active Trench Layout Tuned 1200V CSTBTTM for Lower dV/dt Surge and Turn-on Switching Loss", Proceedings of the 2016 28th International Symposium on Power Semiconductor Devices and ICs (ISPSD) Jun. 12-16, 2016, Prague, Czech Republic, pp. 1-4 (Year: 2016).*
JP-2006032676-A machine translation (Year: 2006).*
Application of Aslanian, 590 F.2d 911 (1979), 200 USPQ 500 (Year: 1979).*
KSR Intern. Co. v. Teleflex Inc., 127 S.Ct. 1727 (2007) (Year: 2007).*
Yoshida et al., "The Second-generation 600V RC-IGBT with optimized FWD", Proceedings of the 2016 28th International Symposium on Power Semiconductor Devices and ICs (ISPSD), Jun. 12-16, 2016 (Year: 2016).*
International Search Report issued in PCT/JP2015/074062; mailed Nov. 2, 2015.
An Office Action mailed by the Japanese Patent Office on Jan. 29, 2019, which corresponds to Japanese Patent Application No. 2017-536136 and is related to U.S. Appl. No. 15/741,591.
An Office Action; "Notification of Reasons for Refusal," issued by the Japanese Patent Office on Jul. 24, 2018, which corresponds to Japanese Patent Application No. 2017-536136 and is related to U.S. Appl. No. 15/741,591; with English language translation.
Notification of Transmittal of Copies of Translation of the International Preliminary Report on Patentability and Translation of Written Opinion of the International Searching Authority; PCT/JP2015/074062; mailed on Mar. 8, 2018.
An Office Action mailed by the Japanese Patent Office on Aug. 20, 2019, which corresponds to Japanese Patent Application No. 2017-536136 and is related to U.S. Appl. No. 15/741,591.
An Office Action mailed by the Japanese Patent Office on Nov. 19, 2019, which corresponds to Japanese Patent Application No. 2017-536136.
An Office Action mailed by the German Patent Office on Mar. 11, 2020, which corresponds to German Patent Application No. 11 2015 006 832.5.
An Office Action mailed by the State Intellectual Property Office of the People's Republic of China on Jul. 3, 2020, which corresponds to Chinese Patent Application No. 201580082726.7 and is related to U.S. Appl. No. 15/741,591; with English lanuague translation.
An Office Action mailed by the Japanese Patent Office on Jul. 14, 2020, which corresponds to Japanese Patent Application No. 2019-181852 and is related to U.S. Appl. No. 15/741,591; with English language translation.
An Office Action issued by the German Patent and Trademark Office on Oct. 4, 2023, which corresponds to German Patent Application No. 112015006832.5 and is related to U.S. Appl. No. 15/741,591; with English language translation.
An Office Action mailed by the China National Intellectual Property Administration on Feb. 8, 2021, which corresponds to Chinese Patent Application No. 201580082726.7 and is related to U.S. Appl. No. 15/741,591; with English language translation.

* cited by examiner

SEMICONDUCTOR DEVICE

FIELD

This invention relates to a semiconductor device for use in, for example, the switching of a large current.

BACKGROUND

Recently, insulated gate bipolar transistors (IGBTs) have been widely used for motor control and the like in electrical household appliances such as air conditioners and refrigerators, railroad inverters, and industrial robots, which have become more energy efficient and smaller. To improve the efficiency of electric power system equipment, reducing the steady loss and turn-on loss of an IGBT is required.

Patent Document 1 discloses an IGBT having a trench structure in which dummy gates connected to an emitter electrode are disposed on both sides of each of active trench gates connected to a gate and in which an n-type source is formed in a p-type base layer between the active trench gate and the dummy gate.

Patent Document 2 discloses an IGBT in which an n-type source is formed in a p-type base layer between adjacent active trench gates.

PRIOR ART

Patent Literature

Patent Document 1: Japanese Patent Application Publication No. 2002-016252
Patent Document 2: Japanese Patent Application Publication No. 2003-188382

SUMMARY

Technical Problem

There are cases where an emitter of a p-side semiconductor device having a collector connected to the high-potential side (p side) of a power source and a collector of an n-side semiconductor device having an emitter connected to the low-potential side (n side) of the power source are connected. A load is connected to a connection point between the p-side semiconductor device and the n-side semiconductor device. A freewheeling diode is connected to each of the p-side semiconductor device and the n-side semiconductor device. The freewheeling diode connected in anti-parallel to the p-side semiconductor device is called a p-side diode, and the freewheeling diode connected in anti-parallel to the n-side semiconductor device is called an n-side diode.

When the p-side semiconductor device is turned on in a state in which a reflux current is flowing through the n-side diode, a recovery current flows through the n-side diode. For example, in the case where a semiconductor device disclosed in Patent Document 1 or 2 is employed as the p-side semiconductor device, recovery dV/dt of the n-side diode changes in accordance with the collector current of the p-side semiconductor device. Specifically, recovery dV/dt of the n-side diode for a low current of the p-side IGBT at the time of turn-on loss is larger than recovery dV/dt for the rated current of the p-side IGBT. This is shown in FIG. 15. In FIG. 15, the "low-current side" means that the collector current of the p-side semiconductor device is small, and the "rated-current side" means that the collector current of the p-side semiconductor device is large. When the collector current of the p-side semiconductor device is small, recovery dV/dt of the n-side diode is large. Meanwhile, when the collector current of the p-side semiconductor device is large, recovery dV/dt of the n-side diode is small.

Thus, when recovery dV/dt of a diode has current dependency, the following problem occurs. Specifically, the gate resistance of a semiconductor device is set so that large recovery dV/dt may have a predetermined value. Accordingly, for example, when the gate resistance is determined so that low-current-side recovery dV/dt may be 20 kV/µs, rated-current-side dV/dt (on which the evaluation of turn-on loss is based) becomes approximately 10 kV/µs. As a result, the switching time of the semiconductor device becomes long, and turn-on loss (turn-on loss) at the time of turn-on increases. In other words, in the case where recovery dV/dt of the diode has current dependency, turn-on loss increases.

The present invention has been accomplished to solve the above-described problem, and an object of the present invention is to provide a semiconductor device which can reduce the dependency of recovery dV/dt of a freewheeling diode on a collector current of a semiconductor device.

Means for Solving the Problems

According to a present invention, a semiconductor device includes a semiconductor substrate, an emitter electrode formed on the semiconductor substrate, a gate electrode formed on the semiconductor substrate, a source layer of a first conductivity type formed on the semiconductor substrate, a base layer of a second conductivity type formed on the semiconductor substrate, a collector electrode formed under the semiconductor substrate, a plurality of active trench gates formed on a top-surface side of the semiconductor substrate and connected to the gate electrode, and a plurality of dummy trench gates formed on the top-surface side of the semiconductor substrate and not connected to the gate electrode, wherein first structures, each including three or more of the active trench gates arranged side by side, and second structures, each including three or more of the dummy trench gates arranged side by side, are alternately provided.

Other features of the present invention will become apparent from the following description.

Advantageous Effects of Invention

This invention provides a semiconductor device in which first structures, each including three or more active trench gates arranged side by side, and second structures, each including three or more dummy trench gates arranged side by side, are alternately provided, and thereby reduces the dependency of recovery dV/dt of a freewheeling diode on a collector current of the semiconductor device.

DESCRIPTION OF THE EMBODIMENTS

Semiconductor devices according to embodiments of the present invention will be described with reference to the drawings. The same or corresponding components will be denoted by the same reference signs, and the repetition of explanation thereof may be omitted.

Embodiment 1

Figure 1:
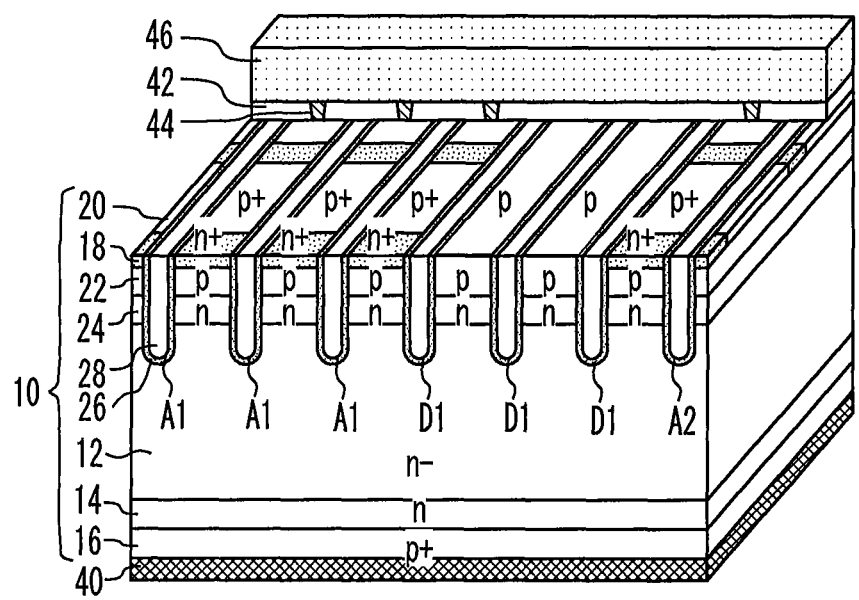
FIG. 1 is a partial cross-sectional perspective view of a semiconductor device according to Embodiment 1.

FIG. 1 is a sectional perspective view of partially showing a semiconductor device according to Embodiment 1 of the present invention. This semiconductor device is an IGBT. This semiconductor device includes a semiconductor substrate 10. The semiconductor substrate 10 has an n$^-$-type drift layer 12 formed therein. An n-type buffer layer 14 is formed under the drift layer 12. A p$^+$-type collector layer 16 is formed under the buffer layer 14.

An n$^+$-type source layer 18 and a p$^+$-type contact layer 20 are formed on the front surface side of the semiconductor substrate 10. A p-type base layer 22 is formed under the source layer 18. An n-type carrier stored layer 24 is formed under the base layer 22. The aforementioned drift layer 12 is located under the carrier stored layer 24.

A plurality of active trench gates A1 and A2 and a plurality of dummy trench gates D1 are formed on the top surface side of the semiconductor substrate 10. Each active trench gate is a trench gate electrically connected to a gate electrode, and each dummy trench gate is a trench gate electrically connected to an emitter electrode. The plurality of active trench gates A1 and A2 and the plurality of dummy trench gates D1 are formed by forming grooves in the semiconductor substrate 10, forming insulating films 26 on wall surfaces of the grooves, and then filling the grooves with conductors 28. The plurality of active trench gates A1 and A2 and the plurality of dummy trench gates D1 extend from the front surface of the semiconductor substrate 10 and pass through the source layer 18, the base layer 22 and the carrier stored layer 24 to reach the drift layer 12.

The above-described source layer 18 is formed to be in contact with one or both of side walls of each of the active trench gates A1 and A2. However, the source layer 18 may be formed in a region sandwiched between the dummy trench gates D1.

A collector electrode 40 is formed under the semiconductor substrate 10. An interlayer insulating film 42 is provided on the top surface of the semiconductor substrate 10. The interlayer insulating film 42 has openings. Emitter contacts 44, which contact the contact layer 20 and the source layer 18, are provided in the openings. The emitter contacts 44 are formed on the base layer 22. An emitter electrode 46, which contacts the emitter contacts 44, is formed on the interlayer insulating film 42.

Figure 2:
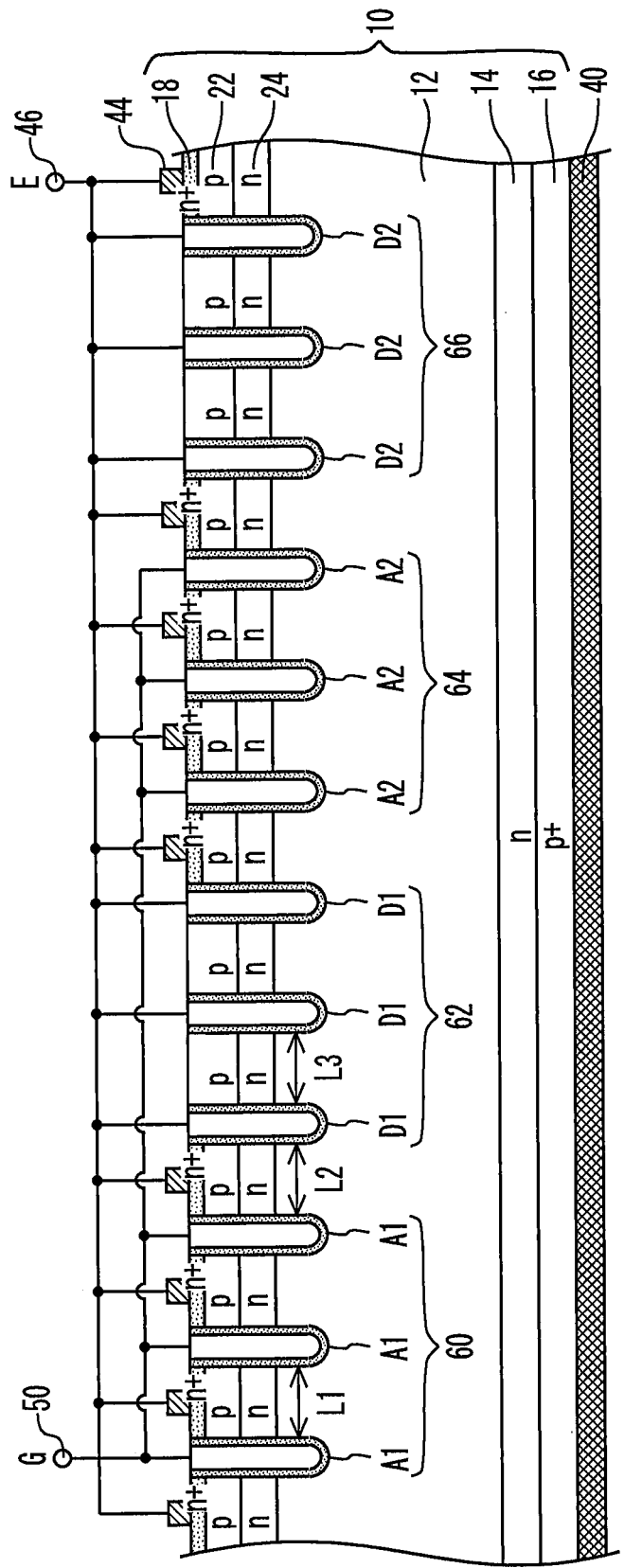
FIG. 2 is a cross-sectional view of the semiconductor device.

FIG. 2 is a cross-sectional view of the semiconductor device. The arrangement of trench gates will be described with reference to FIG. 2. The emitter electrode 46 and a gate electrode 50 are formed on the semiconductor substrate 10. Three active trench gates A1 and three active trench gates A2 are connected to the gate electrode 50. Three dummy trench gates D1 and three dummy trench gates D2 are not connected to the gate electrode 50 but connected to the emitter electrode 46.

The emitter contacts 44 are in contact with portions of the source layer 18 which are adjacent to the active trench gates A1 and A2. Accordingly, the portions of the source layer 18 which are adjacent to the active trench gates A1 and A2 are connected to the emitter electrode 46. Meanwhile, portions of the base layer 22 which are sandwiched between the dummy trench gates D1 and D2 are not connected to the emitter electrode 46.

The three active trench gates A1 are arranged side by side to form a first structure 60. Beside the first structure 60, the three dummy trench gates D1 are arranged side by side to form a second structure 62. Beside the second structure 62, the three active trench gates A2 are arranged side by side to form a first structure 64. Beside the first structure 64, the three dummy trench gates D2 are arranged side by side to form a second structure 66. Thus, first structures, each including three active trench gates, and second structures, each including three dummy trench gates, are alternately provided.

Figure 3:
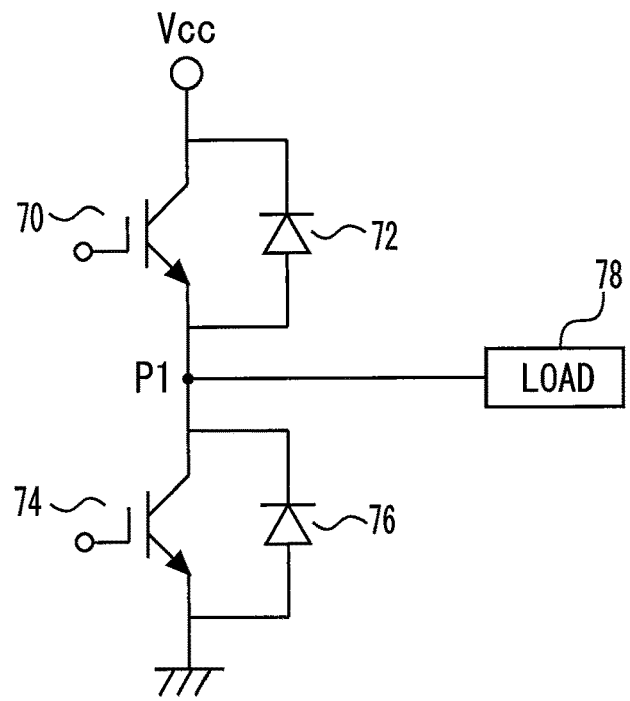
FIG. 3 is a circuit diagram showing an example of a circuit configured using the semiconductor device.

FIG. 3 is a circuit diagram showing an example of a circuit configured using the semiconductor device. A load 78 is connected to a connection point P1 between a p-side semiconductor device 70 and an n-side semiconductor device 74. A p-side diode 72 as a freewheeling diode is connected to the p-side semiconductor device 70, and an n-side diode 76 as a freewheeling diode is connected to the n-side semiconductor device 74. Semiconductor devices according to Embodiment 1 of the present invention are employed as the p-side semiconductor device 70 and the n-side semiconductor device 74.

Referring back to FIG. 2, the distance L1 between the active trench gates in the first structures 60 and 64 is 1.5 μm or less. Examples of the distance L2 between the active trench gate and the dummy trench gate and the distance L3 between the dummy trench gates include, but are not limited to, approximately 1.5 μm.

One example of a method for manufacturing a semiconductor device according to Embodiment 1 of the present invention will be described. First, an n-type semiconductor substrate is prepared. Subsequently, an oxide film is formed as a mask, and a resist pattern is formed on the oxide film by photolithography. The oxide film is etched using the resist pattern as a mask. Subsequently, the resist pattern is removed.

Subsequently, using a mask, phosphorus (P) ions are implanted to form an n-type carrier stored layer. Subsequently, boron (B) ions may be implanted using the same mask. This reduces the number of masks to be used, but independent masks may be used. Subsequently, the implanted phosphorus and boron are diffused by drive-in diffusion. Thus, the n-type carrier stored layer 24 and the p-type base layer 22 are formed. The impurity concentration of the carrier stored layer 24 may be any value which is higher than that of the drift layer 12 and lower than that of the base layer 22, e.g., a value in the range of $1\times10^{15}$ to $1\times10^{16}$ cm$^3$. The diffusion depth of the carrier stored layer 24 is, for example, 2.0 µm. The surface concentration of the p-type base layer 22 is, for example, $1\times10^{17}$ to $1\times10^{18}$ cm$^3$, and the diffusion depth thereof is, for example, 2.0 µm.

Then, using a mask made of an oxide film, arsenic (As) ions are implanted as an impurity, and the implanted arsenic is diffused by drive-in diffusion. Thus, the n-type source layer 18 is formed on the p-type base layer 22. The impurity concentration of the source layer 18 is, for example, $5\times10^{18}$ to $5\times10^{19}$ cm$^{-3}$, and the diffusion depth thereof is, for example, 0.5 µm.

Then, active trench gates and dummy trench gates are formed. Using a mask made of an oxide film patterned so that active trench gates may be connected to a gate electrode and that dummy trench gates may be connected to an emitter electrode, trenches which pass through the base layer 22 and the carrier stored layer 24 are formed by dry etching. The depths of the trenches are, for example, 6.0 µm, and the widths thereof are, for example, 1.0 µm.

Then, the oxide film mask is removed, and an oxide film (insulating films 26) for covering side walls of the trenches is formed. Subsequently, the trenches covered with the insulating films 26 are filled with the conductors 28 such as polysilicon. Subsequently, the interlayer insulating film 42 made of an oxide film or the like is formed to insulate the conductors 28 in the trenches. The thickness of the interlayer insulating film 42 is, for example, 1.0 µm.

Subsequently, using a mask made of an oxide film, the emitter contacts 44 are formed. Subsequently, the emitter electrode 46 is formed. The emitter electrode 46 is made of, for example, aluminum or aluminum-silicon. The film thickness of the emitter electrode 46 is, for example, 4.0 µm. Further, the gate electrode 50, which is insulated from the emitter electrode 46, is also formed.

Subsequently, P ions and B ions are implanted into the bottom surface of the semiconductor substrate 10, and the p-type collector layer 16 and the n-type buffer layer 14 are formed by annealing. Annealing may be performed in one step as described above in order to reduce the number of steps, or may be performed in two steps, which are performed after the implantation of P ions and the implantation of B ions, respectively. Subsequently, the collector electrode 40 is formed. The material and the film thickness of the collector electrode 40 may be set as desired.

The present inventors have discovered that increasing the value (Cgc/Cge) obtained by dividing the gate-collector capacitance (Cgc) of a semiconductor device by the gate-emitter capacitance (Cge) is effective in reducing the dependency of recovery dV/dt of a freewheeling diode on the collector current of the semiconductor device. More specifically, an increase in recovery dV/dt for a low current can be reduced by increasing Cgc of the semiconductor device. Moreover, recovery dV/dt for a large current (rated current) can be increased by reducing Cge of the semiconductor device. Switching time and turn-on loss can be reduced by increasing the value Cgc/Cge. The semiconductor device according to Embodiment 1 of the present invention has been manufactured based on this knowledge.

Figure 4:
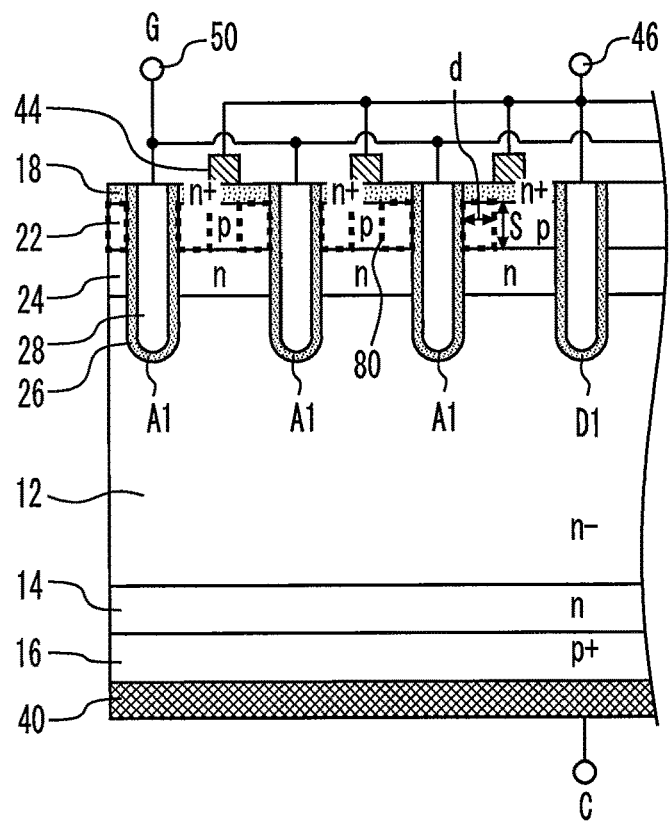
FIG. 4 shows how the depletion layer is extended during the operation of the semiconductor device.

The semiconductor device according to Embodiment 1 of the present invention has a configuration suitable for reducing Cge while maintaining the value of Cgc. This will be explained with reference to FIG. 4, which shows how the depletion layer is extended during the operation of the semiconductor device. When the voltage Vge is applied between the gate electrode 50 and the emitter electrode 46, depletion layers 80 spread from the side walls of the active trench gates A1 in the base layer 22. For example, the depletion layers 80 are formed in regions indicated by dashed lines. The gate-emitter capacitance Cge of the semiconductor device depends on the oxide layer capacitance (capacitor including the insulating film 26 as a dielectric layer) and the depletion capacitance. Accordingly, Cge decreases as the distances d of the depletion layers 80 increase and the surface areas S thereof decrease.

As the applied voltage Vge increases, the depletion layers extended from the side walls of adjacent active trench gates overlap, and the distances d of the depletion layers increase. In Embodiment 1 of the present invention, the distance between the active trench gates in the first structures is 1.5 µm or less, and the depletion layers can be overlapped even when the applied voltage Vge is low. Overlapping depletion layers form one depletion layer having a large distance d. Accordingly, Cge can be sufficiently reduced.

The reduction of the surface areas S of the depletion layers is realized by adjusting the impurity concentration of the carrier stored layer 24. Specifically, the impurity concentration of the carrier stored layer 24 is set to be larger than the impurity concentration of the drift layer 12. Moreover, the impurity concentration of the carrier stored layer 24 is set to be smaller than the impurity concentration of the source layer 18. Since the impurity concentration of the carrier stored layer 24 is set to be larger than the impurity concentration of the drift layer 12, large-scale depletion layers can be prevented from being formed in the carrier stored layer 24. In other words, an increase in the surface areas S of the depletion layers can be reduced. Moreover, since the impurity concentration of the carrier stored layer 24 is set to be smaller than the impurity concentration of the source layer 18, the impurity concentration of the carrier stored layer 24 can be prevented from becoming extremely large, and holes can be prevented from becoming less likely to pass through the carrier stored layer 24 upward.

Since the distance L1 between adjacent active trench gates is set to 1.5 µm or less, and the impurity concentration of the carrier stored layer 24 is set to be larger than the impurity concentration of the drift layer 12, the depletion layer capacitance can be reduced. If the above-described impurity concentration of the carrier stored layer cannot be achieved, Cge cannot be sufficiently reduced, and Cgc is increased.

In a region in which an active trench gate and a dummy trench gate are adjacent to each other, a depletion layer spreads from the side wall of the active trench gate, but no depletion layer spreads from the side wall of the dummy trench gate. Accordingly, there is no Cge reduction effect obtained by overlapping two depletion layers. Thus, the arrangement of active trench gates and dummy trench gates needs to be determined by taking into account the density of the region in which the active trench gate and the dummy trench gate are adjacent to each other.

Figure 5:
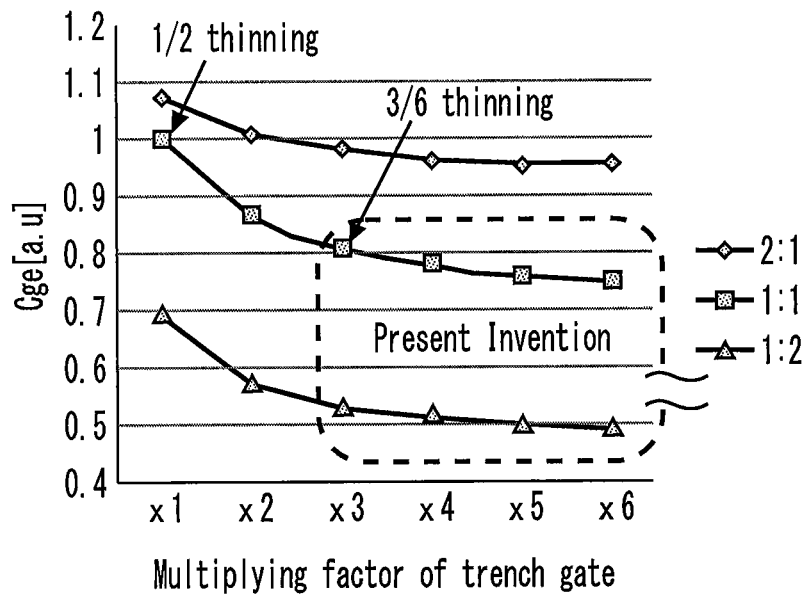
FIG. 5 is a graph showing the relationship between the arrangement of trench gates and Cge.

FIG. 5 is a graph showing the relationship between the arrangement of active trench gates and dummy trench gates and Cge. The ratio 2:1 means that the ratio (number ratio) of the number of active trench gates to the number of dummy trench gates is 2:1. The ratio 1:1 means that the ratio of the number of active trench gates to the number of dummy trench gates is 1:1. The ratio 1:2 means that the ratio of the number of active trench gates to the number of dummy trench gates is 1:2.

The words "multiplying factor of trench gate" on the horizontal axis indicate the number of trench gates constituting 1 in the above-described ratios. Specifically, a description focusing on six plotted points for 1:1 in FIG. 5 will be made. For 1:1, when the multiplying factor of trench gate is ×1, one active trench gate and one dummy trench gate are alternately provided. One active trench gate plus one dummy trench gate equals two trench gates, and one of the two trench gates is active. Accordingly, this case is referred to as 1/2 thinning. For 1:1, when the multiplying factor of trench gate is ×2, two active trench gates and two dummy trench gates are alternately provided.

For 1:1, when the multiplying factor of trench gate is ×3, three active trench gates and three dummy trench gates are alternately provided. The semiconductor device according to Embodiment 1 of the present invention corresponds to the case where the multiplying factor of trench gate is ×3 for 1:1. Three active trench gates plus three dummy trench gates equal six trench gates, and three of the six trench gates are active. Accordingly, this case is referred to as 3/6 thinning.

For 1:1, when the multiplying factor of trench gate is ×4, four active trench gates and four dummy trench gates are alternately provided. When the multiplying factor of trench gate is ×5, five active trench gates and five dummy trench gates are alternately provided. When the multiplying factor of trench gate is ×6, six active trench gates and six dummy trench gates are alternately provided.

For example, for 2:1, when the multiplying factor of trench gate is ×3, six active trench gates and three dummy trench gates are alternately provided. For example, for 1:2, when the multiplying factor of trench gate is ×3, three active trench gates and six dummy trench gates are alternately provided. Using the aforementioned word "thinning," each of 18 plotted points in FIG. 5 can be concisely expressed. For example, for a number ratio of 2:1, the case where the multiplying factor of trench gate is ×1 is referred to as "1/3 thinning," and, for a number ratio of 1:2, the case where the multiplying factor of trench gate is ×1 is referred to as "2/3 thinning."

As apparent from the above, increasing the multiplying factor of trench gate means multiplying the number of active trench gates and the number of dummy trench gates by integers while the number ratio of active trench gates to dummy trench gates is fixed.

Embodiment 1 of the present invention employing "3/6 thinning," and Cge can be reduced by 20% compared to a semiconductor device of 1/2 thinning. Further, Cgc is not increased. Accordingly, Cgc/Cge can be increased by 20% compared to 1/2 thinning. Thus, the dependency of recovery dV/dt of the freewheeling diode on the collector current of the semiconductor device can be reduced.

FIG. 5 indicates that low Cge can also be obtained when the ratio (number ratio) of the number of active trench gates to the number of dummy trench gates is 1:2. However, when the number ratio is 2:1, Cge increases compared to the case where the number ratio is 1:1. Since 1/3 thinning, which is a basic structure for the case where the number ratio is 2:1, is a structure in which active trench gates are adjacent to each other, Cge reduction effect obtained by active trench gates being adjacent to each other is originally provided. Accordingly, Cge cannot be greatly reduced by increasing the multiplying factor of trench gate.

Embodiment 1 of the present invention employs 3/6 thinning, but other arrangement may be employed. By employing a configuration in which the first structures, each including three or more active trench gates arranged side by side, and the second structures, each including three or more dummy trench gates arranged side by side, are alternately provided, the number of adjacent active trench gates can be increased, and the density of adjacent active and dummy trench gates can be reduced. Accordingly, Cge can be reduced. In addition to this, when the number of dummy trench gates in the second structure is larger than the number of active trench gates in the first structure (e.g., 1:2), Cge can be significantly reduced. It should be noted that while the carrier stored layer 24 is formed in Embodiment 1 of the present invention, the present invention is not limited to this, and the carrier stored layer 24 does not necessarily need to be formed.

Figure 6:
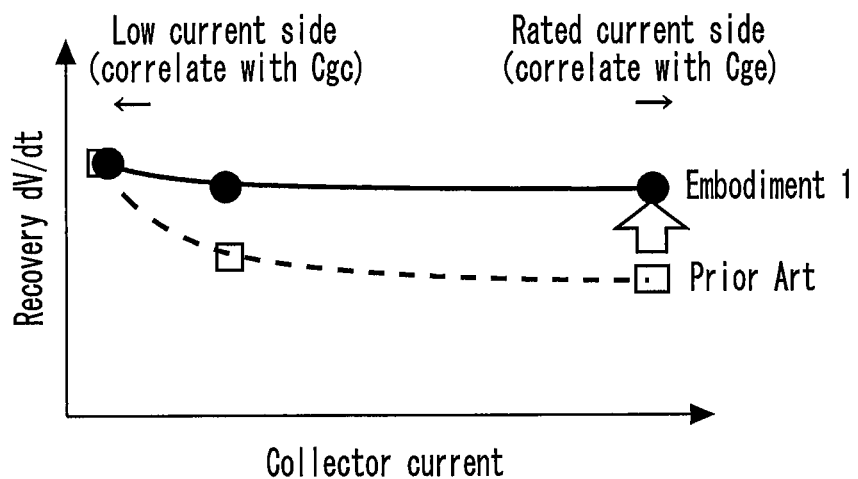
FIG. 6 shows equalized recovery dV/dt.
Figure 7:
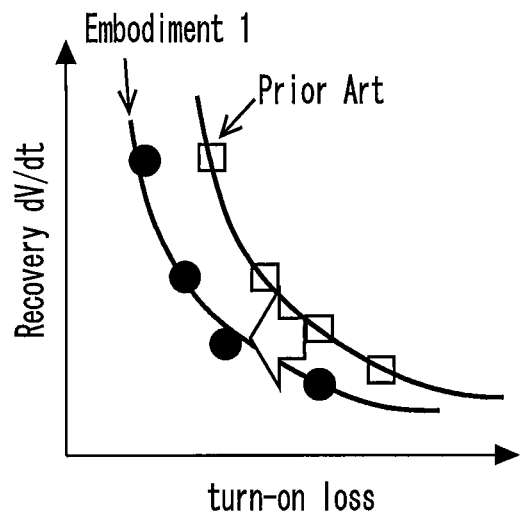
FIG. 7 shows turn-on loss reduction effect.

FIG. 6 is a view showing the relationship between the collector current of the semiconductor device according to Embodiment 1 of the present invention and recovery dV/dt of the freewheeling diode. The semiconductor device of Embodiment 1 realizes small Cge, which results in large Cgc/Cge, and the dependency of recovery dV/dt of the freewheeling diode on the collector current of the semiconductor device can be reduced. FIG. 7 is a graph for explaining turn-on loss reduction effect. FIG. 7 indicates that turn-on loss can be reduced by reducing Cge as described above.

In the semiconductor device according to Embodiment 1 of the present invention, steady loss (Vice (sat)) can be reduced. Specifically, since portions of the base layer 22 which are sandwiched between the dummy trench gates D1 or D2 are not connected to the emitter electrode 46, a floating base layer is formed. The floating base layer facilitates Injection Enhancement effect (IE effect). Holes are stored in the floating base layer, and conductivity modulation occurs. Accordingly, the resistivity of the drift layer 12 decreases, and Vce (sat) can be reduced.

The semiconductor device according to Embodiment 1 of the present invention can be variously modified. For example, the semiconductor device may constitute a trench MOSFET or an RC-IGBT rather than an IGBT. The semiconductor substrate 10 may be made of silicon, or may be made of a wide bandgap semiconductor having a larger bandgap than silicon. Examples of wide-bandgap semiconductors include silicon carbide, gallium-nitride materials, and diamond. The n-type layers may be replaced by p type, and the p-type layers may be replaced by n type. In other words, each layer of the semiconductor substrate is formed as a first conductivity type or a second conductivity type. The above-described modified examples can be appropriately applied to semiconductor devices according to embodiments below. It should be noted that the semiconductor devices according to the embodiments below have many things in common with Embodiment 1, and therefore differences from Embodiment 1 will be mainly described.

Embodiment 2

Figure 8:
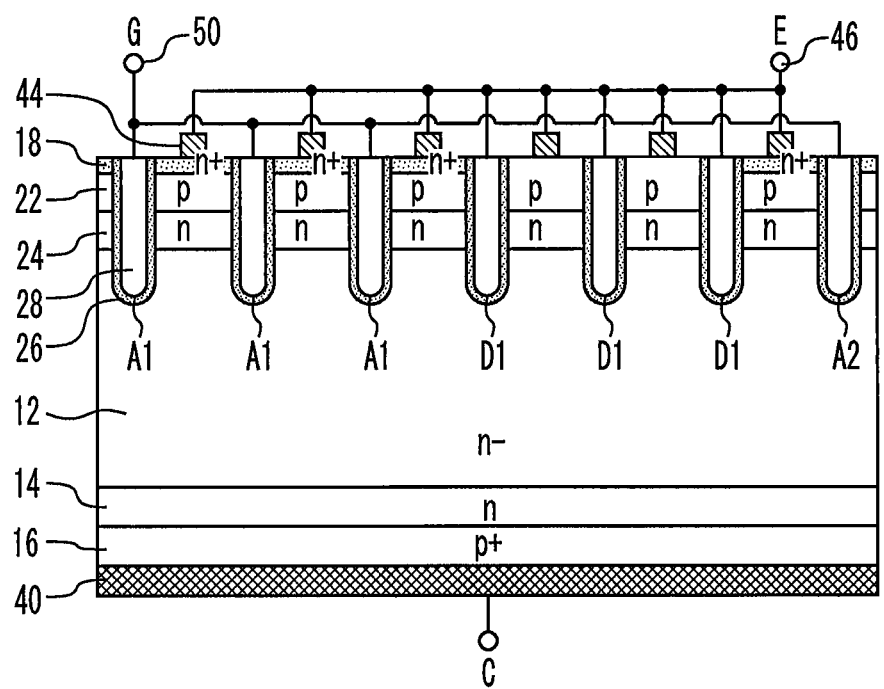
FIG. 8 is a partial cross-sectional view of a semiconductor device according to Embodiment 2.

FIG. 8 is a partial cross-sectional view of a semiconductor device according to Embodiment 2. Portions of the base layer 22 which are sandwiched between the dummy trench gates D1 are connected to the emitter electrode 46. Specifically, the emitter contacts 44 are provided on both sides of each dummy trench gate D1 so that the dummy trench gate D1 may be sandwiched between the emitter contacts 44. The pt-type contact layer 20 for reducing the contact resistance may be formed under the emitter contacts 44. The pattern of the contact layer 20 is not limited to a specific pattern, and, for example, may be selectively formed under the emitter contacts 44. By providing the emitter contacts 44 in regions sandwiched between the dummy trench gates D1, the discharge of holes from the emitter contacts 44 is facilitated, and turn-off loss can be reduced.

In particular, when the number of dummy trench gates is large, though Vice (sat) reduction effect is produced by IE effect obtained by the formation of the floating base layer, an increase in turn-off loss becomes a problem. Accordingly, by providing the emitter contacts 44 on the entire base layer 22 as shown in FIG. 8, turn-off loss can be reduced.

Figure 9:
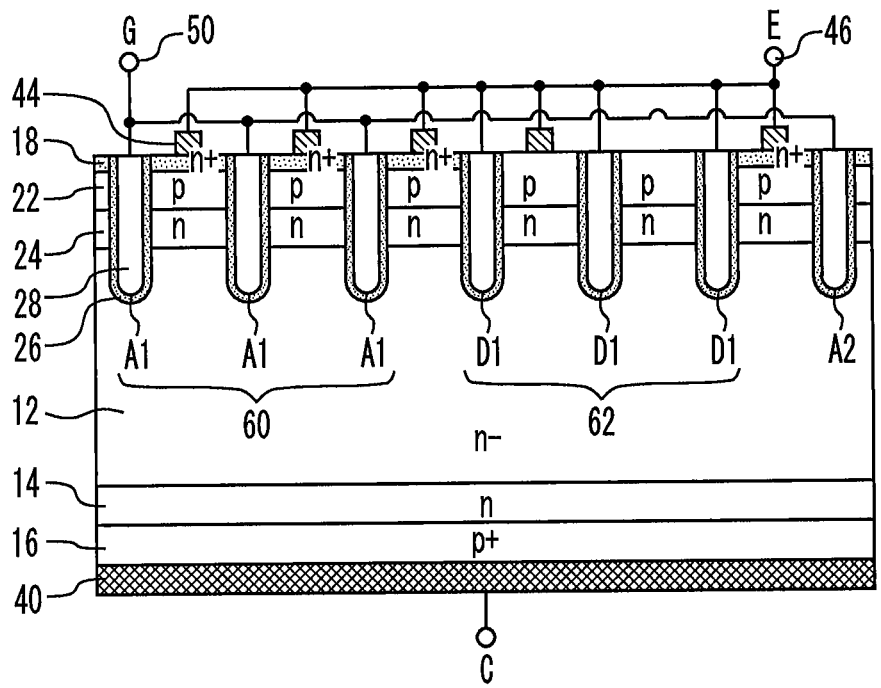
FIG. 9 is a partial cross-sectional view of a semiconductor device according to modified example.

Here, a dummy trench gate D1 may have an emitter contact 44 only on the right side thereof and no emitter contact 44 on the left side thereof. Thus, the amount of holes stored can be adjusted. Alternatively, a dummy trench gate D1 may have emitter contacts 44 on both sides thereof, with another dummy trench gate D1 having an emitter contact 44 only on one side thereof. Referring to FIG. 9, the second structure 62 has two or more portions of the base layer 22 which are sandwiched between the dummy trench gates D1. One of the two or more portions is connected to the emitter electrode 46, and another one thereof is not connected to the emitter electrode 46. This reduces turn-on loss without deteriorating characteristics of trade-off between turn-off loss and Vce (sat).

Embodiment 3

Figure 10:
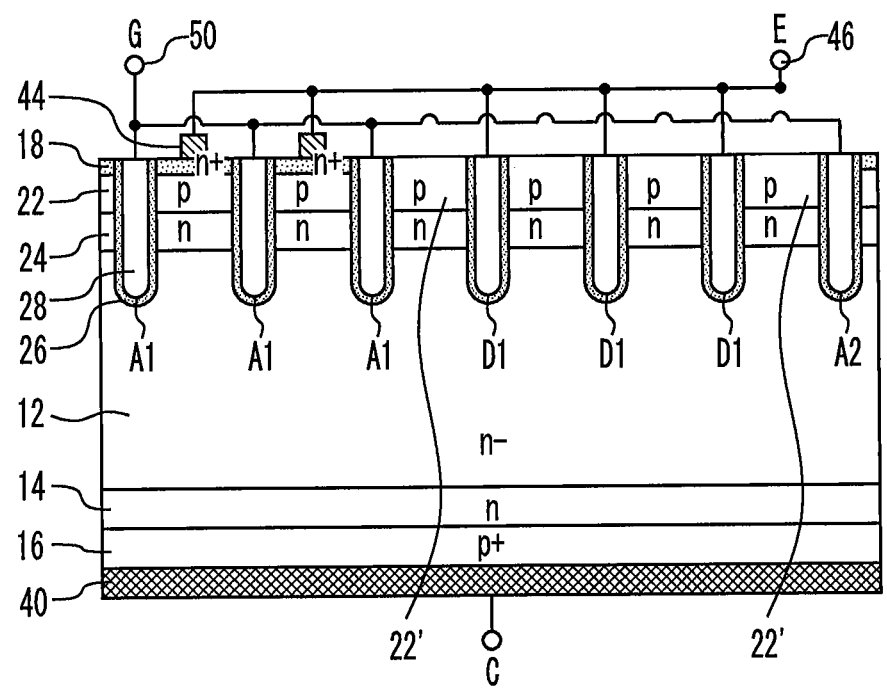
FIG. 10 is a partial cross-sectional view of a semiconductor device according to Embodiment 3.

FIG. 10 is a partial cross-sectional view of a semiconductor device according to Embodiment 3. The emitter electrode 46 (emitter contacts 44) is connected only to portions of the base layer 22 which are sandwiched between the active trench gates. The gate-emitter capacitance Cge generated between the active trench gate and the emitter contact 44 located between the active trench gate and the dummy trench gate is reduced by thinning the emitter contacts 44.

In floating base layers 22' adjacent to the active trench gates, potential fluctuation is caused by holes entering at turn-on, and displacement current occurs. This leads to an increase in dV/dt for a low current. Accordingly, reducing the density of the floating base layers 22' by alternately providing the first structures, each including three or more active trench gates arranged side by side, and the second structures, each including three or more dummy trench gates arranged side by side, as described above is important.

Figure 11:
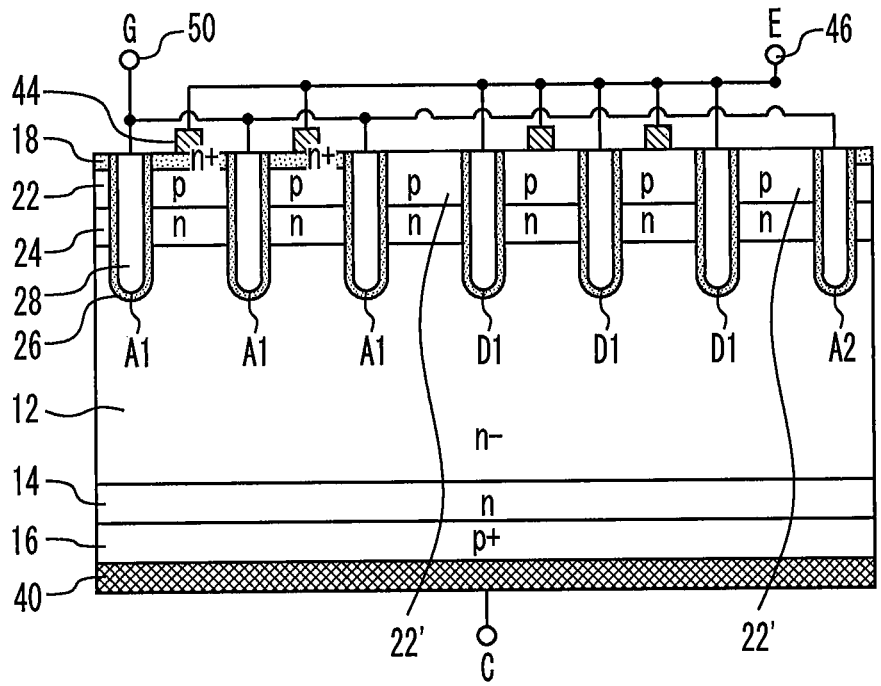
FIG. 11 is a partial cross-sectional view of a semiconductor device according to modified example.

FIG. 11 is a partial cross-sectional view of a semiconductor device according to a modified example. The emitter electrode 46 (emitter contacts 44) is connected only to portions of the base layer 22 which are sandwiched between the active trench gates and portions thereof which are sandwiched between the dummy trench gates. Portions of the base layer 22 which are located between the active trench gate and the dummy trench gate are not provided with emitter contacts 44. This can reduce Cge and turn-off loss while facilitating the discharge of holes from the emitter contacts 44.

Embodiment 4

Figure 12:
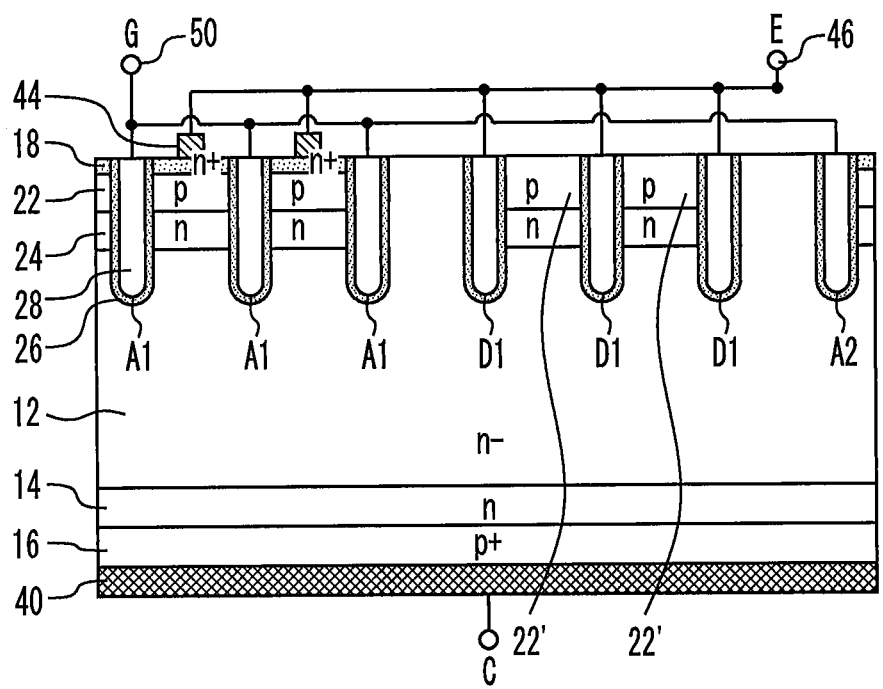
FIG. 12 is a partial cross-sectional view of a semiconductor device according to Embodiment 4.

FIG. 12 is a partial cross-sectional view of a semiconductor device according to Embodiment 4. The base layer 22 is formed except in regions between the active trench gate and the dummy trench gate. Specifically, the base layer 22 is not disposed between the active trench gate A1 and the dummy trench gate D1. This reduces Cge generated between the active trench gate A1 and the emitter contact located between the active trench gate A1 and the dummy trench gate D1.

By alternately providing the first structures, each including three or more active trench gates arranged side by side, and the second structures, each including three or more dummy trench gates arranged side by side, as described above, the proportion of regions (regions between the active trench gate and the dummy trench gate) in which the base layer 22 is omitted decreases, and the proportion of the base layer 22 increases. The base layer 22 has the function of extending the depletion layer to improve the withstand voltage in reverse bias. Accordingly, when the proportion of the base layer 22 is increased as described above, the withstand voltage can be improved.

Embodiment 5

Figure 13:
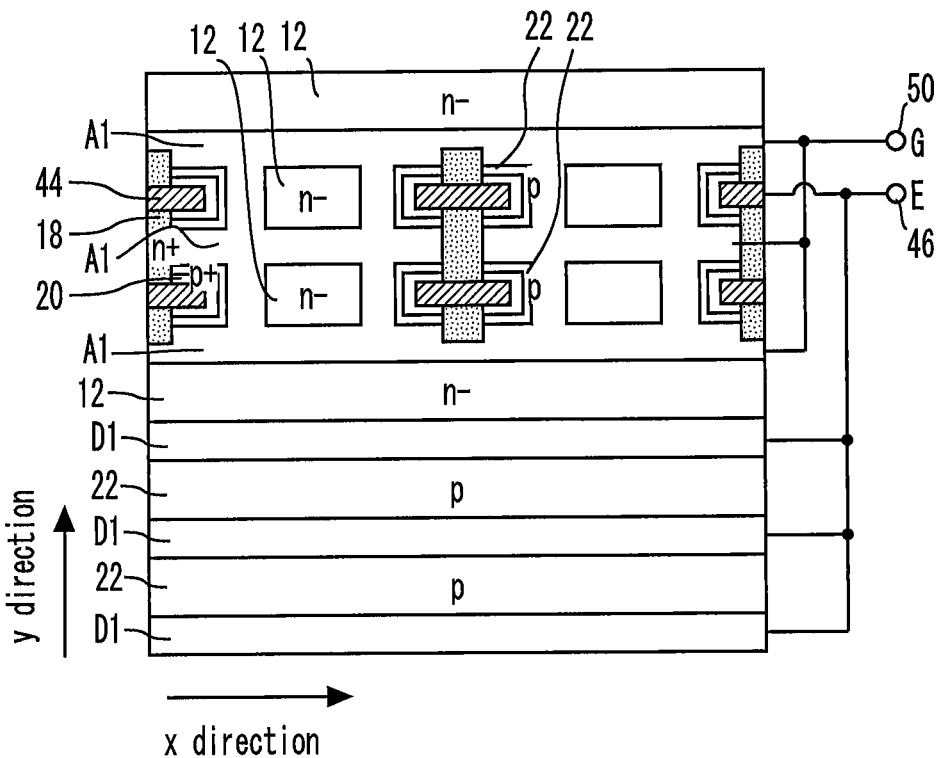
FIG. 13 is a plan view of a semiconductor substrate constituting a semiconductor device according to Embodiment 5.

FIG. 13 is a plan view of a semiconductor substrate constituting a semiconductor device according to Embodiment 5. Three active trench gates A1 extend in the lateral direction. The three active trench gates A1 are connected with active trench gates extending in the width direction thereof, and the active trench gates are in the form of a mesh in planar view. The dummy trench gates D1 are disposed in a stripe shape in planar view. It should be noted that the form of the dummy trench gates D1 is not limited to a stripe shape and may be a mesh shape.

By forming active trench gates in the form of a mesh, the application of voltage between the gate and the emitter causes depletion layers to spread not only in the positive and negative x directions but also in the positive and negative y directions, and the spreading depletion layers overlap each other. Accordingly, the surface area S of the depletion layers decreases, and the distance d of the depletion layer increases. Thus, Cge can be reduced.

The number of active trench gates constituting the first structure is not limited to three. By connecting the three or more active trench gates constituting the first structure to form a first structure in the form of a mesh in planar view, Cge can be reduced.

Embodiment 6

Figure 14:
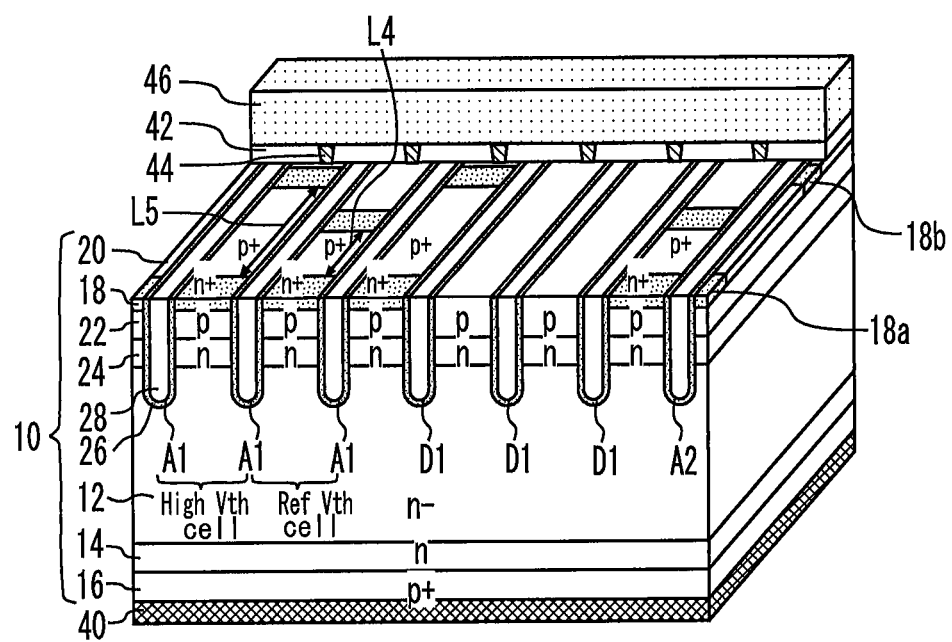
FIG. 14 is a partial cross-sectional perspective view of a semiconductor device according to Embodiment 6.
Figure 15:
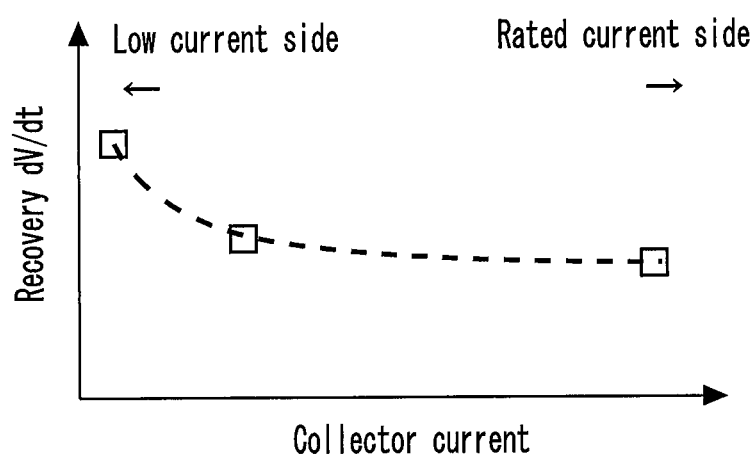
FIG. 15 shows the problem to be solved.

FIG. 14 is a sectional perspective view of part of a semiconductor device according to Embodiment 6. The source layer 18 includes first source layers 18a and second source layers 18b which intersect the plurality of active trench gates A1 and A2 and the plurality of dummy trench gates D1 extending in parallel. The spacing between the first source layer 18a and the second source layer 18b is not constant. Specifically, the spacing between the source layers is not constant and is locally long. An example is a ratio in which the spacing L4 between the source layers is one and in which the spacing L5 between the source layers is ten.

In such a configuration, electron injection efficiency varies between cells. In a cell having a long spacing between the source layers, injection efficiency is small, and the threshold voltage Vth is high. Accordingly, two types of cells, which are high-Vth cells and normal-Vth cells, are formed within the same chip. FIG. 14 shows cells (High Vth cells) with high Vth and cells (Ref Vth cells) with normal Vth. Recovery dV/dt depends on the change with time dVge/dt of the gate-emitter voltage, and dVge/dt depends on the threshold voltage Vth. In the case where dVge/dt sharply increases at turn-on, dV/dt also sharply increases. In the case where two types of cells having different threshold voltages Vth are formed, dVge/dt outputted from the two types of cells have different magnitudes and different phases. Accordingly, in the whole of a chip, a high portion of the dVge/dt peak outputted from one of the cells and a low portion of the dVge/dt peak outputted from the other of the cells overlap each other. Accordingly, a moderate dVge/dt peak is obtained. As a result, the current dependency of recovery dV/dt can be reduced. Further, the peak of the dVge/dt waveform can be reduced, and EMI noise can also be reduced.

It should be noted that features of the semiconductor devices according to the above-described embodiments may be appropriately combined to improve advantageous effects of the invention.

DESCRIPTION OF SYMBOLS 10 semiconductor substrate, 18 source layer, 20 contact layer, 22 base layer, 24 carrier stored layer, 46 emitter electrode, 50 gate electrode, 60,64 first structure, 62,66 second structure, 80 depletion layer, A1,A2 active trench gate, D1,D2 dummy trench gate

The invention claimed is:

1. A semiconductor device comprising:
a semiconductor substrate;
an emitter electrode formed on the semiconductor substrate;
a source layer of a first conductivity type formed on an upper side of the semiconductor substrate;
a base layer of a second conductivity type formed on the upper side of the semiconductor substrate;
a collector electrode formed under the semiconductor substrate;
a plurality of active trench gates formed on a top-surface side of the semiconductor substrate and connected to a gate electrode; and
a plurality of dummy trench gates formed on the top-surface side of the semiconductor substrate and not connected to the gate electrode, wherein
first structures, each including three or more of the active trench gates arranged side by side, and second structures, each including three or more of the dummy trench gates arranged side by side, are alternately provided, the first structures and the second structures together forming parts of an IGBT,
the number of dummy trench gates is equal to or larger than the number of active trench gates,
a collector layer of the second conductivity type formed on a lower side of the semiconductor substrate, and
the collector layer extends directly under each of the first structures and second structures.

2. The semiconductor device according to claim 1, wherein
the semiconductor substrate comprises a carrier stored layer of the first conductivity type formed under the base layer which is formed under the source layer, and a drift layer of the first conductivity type formed under the carrier stored layer,
an impurity concentration of the carrier stored layer is higher than that of the drift layer and lower than that of the source layer, and
the active trench gates and the dummy trench gates penetrate the source layer, the base layer and the carrier stored layer.

3. The semiconductor device according to claim 1, wherein
a portion of the base layer which is adjacent to the active trench gate is connected to the emitter electrode, and
a portion of the base layer which is sandwiched between the dummy trench gates is not connected to the emitter electrode.

4. The semiconductor device according to claim 1, wherein
a portion of the base layer which is adjacent to the active trench gate is connected to the emitter electrode, and
a portion of the base layer which is sandwiched between the dummy trench gates is connected to the emitter electrode.

5. The semiconductor device according to claim 1, wherein the second structure includes two or more portions of the base layer which are sandwiched between the dummy trench gates, one of the two or more portions is connected to the emitter electrode, and another of the two or more portions is not connected to the emitter electrode.

6. The semiconductor device according to claim 1, wherein the first structure is formed in the form of a mesh in planar view by connecting three or more of the active trench gates constituting the first structure.

7. The semiconductor device according to claim 1, wherein
the source layer comprises a first source layer and a second source layer which intersect the plurality of active trench gates and the plurality of dummy trench gates, and
a spacing between the first source layer and the second source layer is not constant.

8. The semiconductor device according to claim 1, wherein the semiconductor device comprises an RC-IGBT.

9. The semiconductor device according to claim 1, wherein the semiconductor substrate comprises a wide bandgap semiconductor.

10. The semiconductor device according to claim 9, wherein the wide bandgap semiconductor comprises any one of silicon carbide, a gallium-nitride material, and diamond.

11. The semiconductor device according to claim 1, wherein
a portion of the base layer, in a region between one of the first structures and one of the second structures, is connected to the emitter electrode.

12. The semiconductor device according to claim 1, wherein
the number of dummy trench gates is equal to the number of active trench gates.

13. The semiconductor device according to claim 1, wherein
a distance between the active trench gates in the first structure is equal to or less than a distance between the dummy trench gates in the second structure.

14. The semiconductor device according to claim 1, wherein
a distance between the active trench gates in the first structure is equal to or less than a distance between an active trench gate at the end of the first structure and an adjacent dummy trench gate in the second structure.

* * * * *